US009935642B2

(12) United States Patent
Hayashi et al.

(10) Patent No.: US 9,935,642 B2
(45) Date of Patent: Apr. 3, 2018

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventors: Nobuhito Hayashi, Chino (JP); Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/236,714

(22) Filed: Aug. 15, 2016

(65) Prior Publication Data
US 2017/0054446 A1   Feb. 23, 2017

(30) Foreign Application Priority Data

Aug. 17, 2015 (JP) .................... 2015-160325

(51) Int. Cl.
| | |
|---|---|
| H01S 1/06 | (2006.01) |
| H03L 7/26 | (2006.01) |
| G02F 1/01 | (2006.01) |
| G04F 5/14 | (2006.01) |
| H03B 17/00 | (2006.01) |

(52) U.S. Cl.
CPC .............. *H03L 7/26* (2013.01); *G02F 1/0126* (2013.01); *G04F 5/14* (2013.01); *G04F 5/145* (2013.01); *H03B 17/00* (2013.01)

(58) Field of Classification Search
CPC ... H03L 7/26; G04F 5/145; G04F 5/14; G02F 1/0126; H03B 17/00
USPC ...................................... 331/94.1, 3
See application file for complete search history.

(56) References Cited

U.S. PATENT DOCUMENTS

| 7,378,913 | B2 | 5/2008 | Laiacano et al. |
| 7,379,486 | B2* | 5/2008 | Lust ..................... G04F 5/145 |
| | | | 372/26 |
| 8,237,514 | B2 | 8/2012 | Aoyama et al. |
| 8,643,441 | B2* | 2/2014 | Aoyama ............... G02F 1/0126 |
| | | | 331/3 |
| 2015/0042327 | A1 | 2/2015 | Bulatowicz |
| 2015/0180489 | A1* | 6/2015 | Chindo .................... H03L 7/26 |
| | | | 331/94.1 |

(Continued)

FOREIGN PATENT DOCUMENTS

| JP | 2014-017824 A | 1/2014 |
| JP | 2015-042977 A | 3/2015 |

(Continued)

*Primary Examiner* — Arnold Kinkead
(74) *Attorney, Agent, or Firm* — Harness, Dickey & Pierce, P.L.C.

(57) ABSTRACT

An atomic oscillator includes an atom cell having an internal space in which alkali metal is encapsulated, a first light source section for making a resonance light pair, which is circularly polarized in the same direction as each other and resonates the alkali metal, enter the internal space using light from a first light source, a second light source for making adjustment light, which is circularly polarized in a rotational direction opposite to the direction of the resonance light pair and resonates the alkali metal, enter the internal space from the same side as the resonance light pair using light from a second light source, and an aperture member disposed between the internal space, and the first light source and the second light source.

20 Claims, 10 Drawing Sheets

(56) References Cited

U.S. PATENT DOCUMENTS

2016/0105150 A1* 4/2016 Hayashi ................ H03B 17/00
 331/94.1

FOREIGN PATENT DOCUMENTS

| JP | 2015-062020 A | 4/2015 |
| JP | 2015-082763 A | 4/2015 |

* cited by examiner

QUANTUM INTERFERENCE DEVICE, ATOMIC OSCILLATOR, ELECTRONIC APPARATUS, AND MOVING OBJECT

CROSS REFERENCE

This application claims the benefit of Japanese Application No. 2015-160325, filed on Aug. 17, 2015. The disclosure of the prior application is hereby incorporated by reference herein in its entirety.

BACKGROUND

1. Technical Field

The present invention relates to a quantum interference device, an atomic oscillator, an electronic apparatus, and a moving object.

2. Related Art

As an oscillator having long-term accurate oscillation characteristics, there has been known an atomic oscillator, which oscillates based on the energy transition of an atom of alkali metal such as rubidium or cesium.

In general, the operation principles of atomic oscillators are roughly classified into a system using a double resonance phenomenon due to light and microwave, and a system using the quantum interference effect (coherent population trapping (CPT)) due to two types of light different in wavelength from each other. The atomic oscillator using the quantum interference effect can be miniaturized to a size smaller than the atomic oscillator using the double resonance phenomenon, and is therefore expected to be mounted on a variety of types of apparatuses in recent years (see, e.g., JP-A-2014-17824 (Document 1)).

As is disclosed in, for example, Document 1, the atomic oscillator using the quantum interference effect is provided with a gas cell having gaseous alkali metal encapsulated therein, a light source for emitting a resonance light pair for resonating the alkali metal in the gas cell, and alight detector (alight receiving section) for detecting the resonance light pair having been transmitted through the gas cell. Further, in such an atomic oscillator, there occurs an electromagnetically induced transparency (EIT) phenomenon in which both of the two types of resonance light are transmitted without being absorbed by the alkali metal in the gas cell in the case in which the difference in frequency between the two types of resonance light is a specific value, and an EIT signal, which is a rapid signal generated due to the EIT phenomenon, is detected with the light detector, and the EIT signal is used as a reference signal.

Here, from a viewpoint of enhancing the short-term frequency stability, the EIT signal is preferably small in linewidth (half bandwidth) and high in strength. Therefore, for example, in the atomic oscillator related to Document 1, there is used the circularly polarized resonance light pair for the purpose of enhancing the strength of the EIT signal.

However, in the atomic oscillator related to Document 1, since the alkali metal in the gas cell is irradiated only with the resonance light pair circularly polarized in the same direction, there occurs bias in the distribution of the magnetic quantum number of the alkali metal. Therefore, the number of the metal atoms having a desired magnetic quantum number making a contribution to the EIT decreases, and as a result, the strength of the EIT signal cannot sufficiently be increased.

SUMMARY

An advantage of some aspects of the invention is to provide a quantum interference device capable of effectively increasing the strength of the EIT signal, and provide an atomic oscillator, an electronic apparatus, and a moving object each equipped with such a quantum interference device.

The advantage described above is achieved by the following aspects of the invention.

A quantum interference device according to an aspect of the invention includes an atom cell having an internal space in which metal is encapsulated, a first light source section having a first light emitting element, and adapted to generate first light including a resonance light pair, which is circularly polarized in the same direction as each other and resonates the metal, using light from the first light emitting element, and make the first light enter the internal space, a second light source section having a second light emitting element, and adapted to generate second light including adjustment light, which is circularly polarized in a rotational direction opposite to the direction of the resonance light pair and resonates the metal, using light from the second light emitting element, and make the second light enter the internal space from the same side as the first light, and an aperture member disposed between the internal space, and the first light emitting element and the second light emitting element, and having an opening.

According to such a quantum interference device, by irradiating the metal in the atom cell with the resonance light pair circularly polarized in the same direction as each other, and the adjustment light circularly polarized in the rotational direction opposite to that of the resonance light pair in the atom cell, the bias in the distribution of the magnetic quantum number due to the resonance light pair can be canceled out or reduced by the adjustment light to thereby reduce the bias in the distribution of the magnetic quantum number of the metal. Therefore, the number of the metal atoms having the desired magnetic quantum number making a contribution to the EIT is increased, and as a result, the advantage of increasing the strength of the EIT signal is markedly developed by using the resonance light pair circularly polarized. Therefore, it is possible to effectively increase the strength of the EIT signal.

Here, since the aperture member is disposed between the internal space, and the first light emitting element and the second light emitting element, the passing areas of the first light and the second light entering the internal space of the atom cell can be made to coincide with or approximate to each other. Therefore, the bias in the distribution of the magnetic quantum number of the metal can efficiently be reduced.

In the quantum interference device according to the aspect of the invention, it is preferable that the first light source section and the second light source section are commonly provided with a ¼ wave plate disposed between the first light emitting element and the second light emitting element, and the internal space.

With this configuration, it is possible to respectively generate the first light including the resonance light pair from the first light source section, and the second light including the adjustment light from the second light source section while reducing the number of components constituting the first light source section and the second light source section.

In the quantum interference device according to the aspect of the invention, it is preferable that the aperture member is disposed between the first light emitting element and the second light emitting element, and the ¼ wave plate.

With this configuration, it is possible to reduce the chance for the light failing to enter the opening of the aperture member to be reflected by the ¼ wave plate to exert a harmful influence.

In the quantum interference device according to the aspect of the invention, it is preferable that the aperture member is disposed between the ¼ wave plate and the internal space.

With this configuration, the distance between the aperture member and the internal space can be shortened. Therefore, the adjustment of the shapes of the passing areas of the first light and the second light entering the internal space of the atom cell becomes easy.

In the quantum interference device according to the aspect of the invention, it is preferable that the aperture member is disposed on the ¼ wave plate.

With this configuration, the aperture member and the ¼ wave plate can be disposed in a lump, and manufacturing of the quantum interference device becomes easy.

In the quantum interference device according to the aspect of the invention, it is preferable that the aperture member is disposed on the atom cell.

With this configuration, the aperture member and the atom cell can be disposed in a lump, and manufacturing of the quantum interference device becomes easy. Further, it is possible to reduce the chance for the position of the opening of the aperture member with respect to the internal space of the atom cell to fluctuate.

It is preferable that the quantum interference device according to the aspect of the invention further includes a lens disposed between the first light emitting element and the second light emitting element, and the aperture member.

With this configuration, the first light and the second light entering the internal space of the atom cell can each be made into parallel light. Therefore, it is possible to reduce the chance for the power density of the first light and the second light to vary in the proceeding direction in the internal space of the atom cell to thereby suppress the spread of the linewidth of the EIT signal, and at the same time, efficiently reduce the bias in the distribution of the magnetic quantum number of the metal.

In the quantum interference device according to the aspect of the invention, it is preferable that the first light emitting element and the second light emitting element are disposed on the same substrate.

In such a case as described above, if the aperture member is eliminated, the area through which only the first light or the second light passes is apt to increase in the internal space of the atom cell. Therefore, in such a case, the advantage obtained by disposing the aperture member becomes conspicuous.

In the quantum interference device according to the aspect of the invention, it is preferable that one of the resonance light pair and the adjustment light is a D1 line, and the other is a D2 line.

With this configuration, it is possible to efficiently increase the strength of the EIT signal.

In the quantum interference device according to the aspect of the invention, it is preferable that the first light emitting element is a surface emitting laser.

With this configuration, the resonance light pair having a desired frequency can easily be generated. Further, since the surface emitting laser emits the light spreading with a predetermined radiation angle, it is possible to easily superimpose the light from the first light emitting element and the light from the second light emitting element on each other to make the result enter the aperture member.

In the quantum interference device according to the aspect of the invention, it is preferable that the second light emitting element is a surface emitting laser.

With this configuration, the adjustment light having a desired frequency can easily be generated. Further, since the surface emitting laser emits the light spreading with a predetermined radiation angle, it is possible to easily superimpose the light from the first light emitting element and the light from the second light emitting element on each other to make the result enter the aperture member.

In the quantum interference device according to the aspect of the invention, it is preferable that the second light emitting element is a light emitting diode.

With this configuration, it is possible to make the linewidth of the adjustment light larger than that of the resonance light pair. Therefore, it is possible to resonate the adjustment light with respect to the metal atom broad in velocity distribution. Therefore, if the central wavelength of the adjustment light has some minor deviations, it is possible to resonate the adjustment light with respect to the metal atom at a desired velocity. As a result, the frequency control of the adjustment light becomes unnecessary, and the device configuration can be simplified. Further, since the light emitting diode emits the light spreading with a predetermined radiation angle, it is possible to easily superimpose the light from the first light emitting element and the light from the second light emitting element on each other to make the result enter the aperture member.

An atomic oscillator according to another aspect of the invention includes the quantum interference device according to the aspect of the invention.

With this configuration, it is possible to provide an atomic oscillator equipped with the quantum interference device capable of effectively increasing the strength of the EIT signal.

An electronic apparatus according to another aspect of the invention includes the quantum interference device according to the aspect of the invention.

With this configuration, it is possible to provide an electronic apparatus equipped with the quantum interference device capable of effectively increasing the strength of the EIT signal.

A moving object according to another aspect of the invention includes the quantum interference device according to the aspect of the invention.

With this configuration, it is possible to provide a moving object equipped with the quantum interference device capable of effectively increasing the strength of the EIT signal.

BRIEF DESCRIPTION OF THE DRAWINGS

The invention will be described with reference to the accompanying drawings, wherein like numbers reference like elements.

FIGS. 6A and 6B are diagrams each showing a distribution of the magnetic quantum number of a sodium atom, wherein FIG. 6A is a diagram showing the distribution in the case of being irradiated with the resonance light as $\sigma_+$ circularly polarized light, and FIG. 6B is a diagram showing the distribution in the case of being irradiated with the resonance light as $\sigma_-$ circularly polarized light.

DESCRIPTION OF EXEMPLARY EMBODIMENTS

Hereinafter, a quantum interference device, an atomic oscillator, an electronic apparatus, and a moving object according to the invention will be explained in detail based on some embodiments shown in the accompanying drawings.

1. Atomic Oscillator

Quantum Interference Device

Firstly, the atomic oscillator (atomic oscillator equipped with the quantum interference device) according to the invention will be described. It should be noted that although an example of applying the quantum interference device according to the invention to the atomic oscillator will hereinafter be described, the quantum interference device according to the invention is not limited to the above, but can be applied to a device such as a magnetic sensor or a quantum memory.

First Embodiment

Firstly, an atomic oscillator according to a first embodiment of the invention will briefly be explained.

Figure 1:
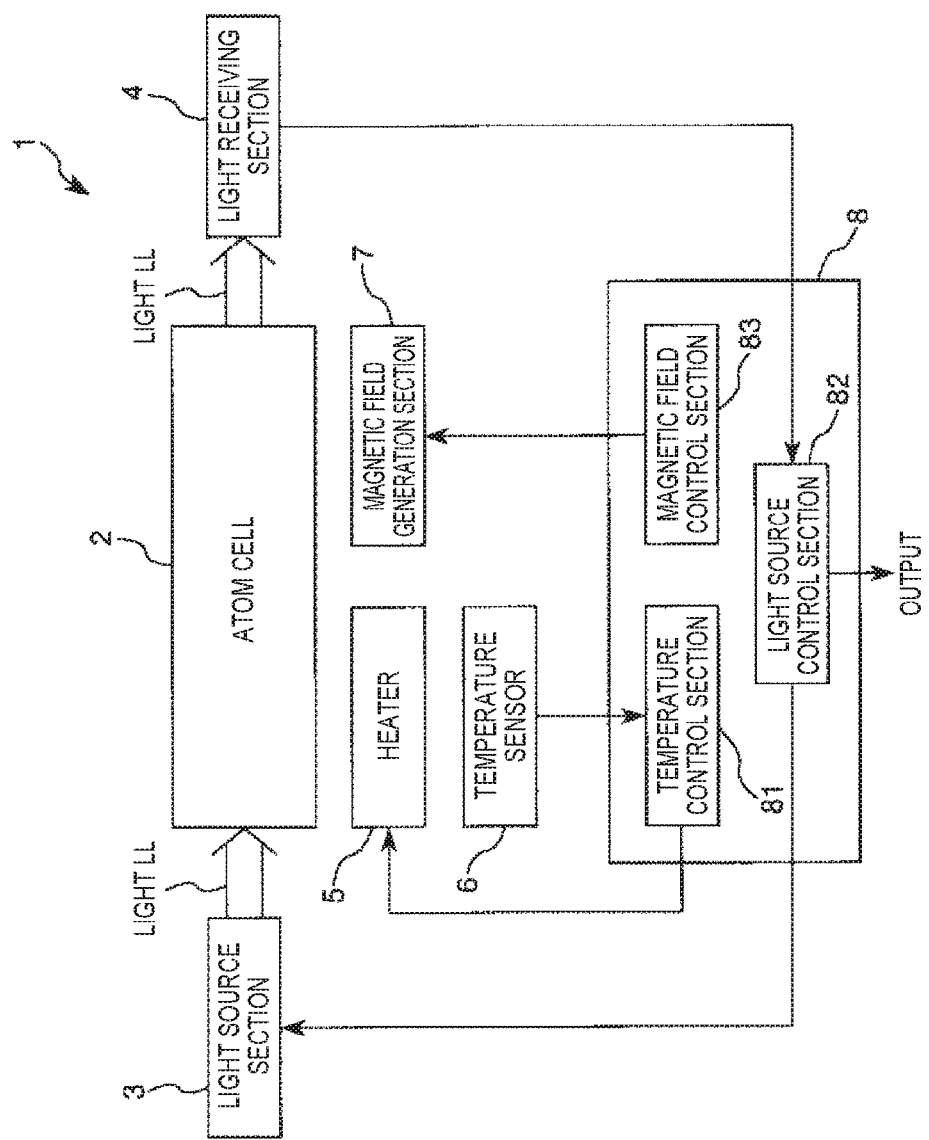
FIG. 1 is a schematic diagram showing an atomic oscillator (a quantum interference device) according to a first embodiment of the invention.
Figure 2:
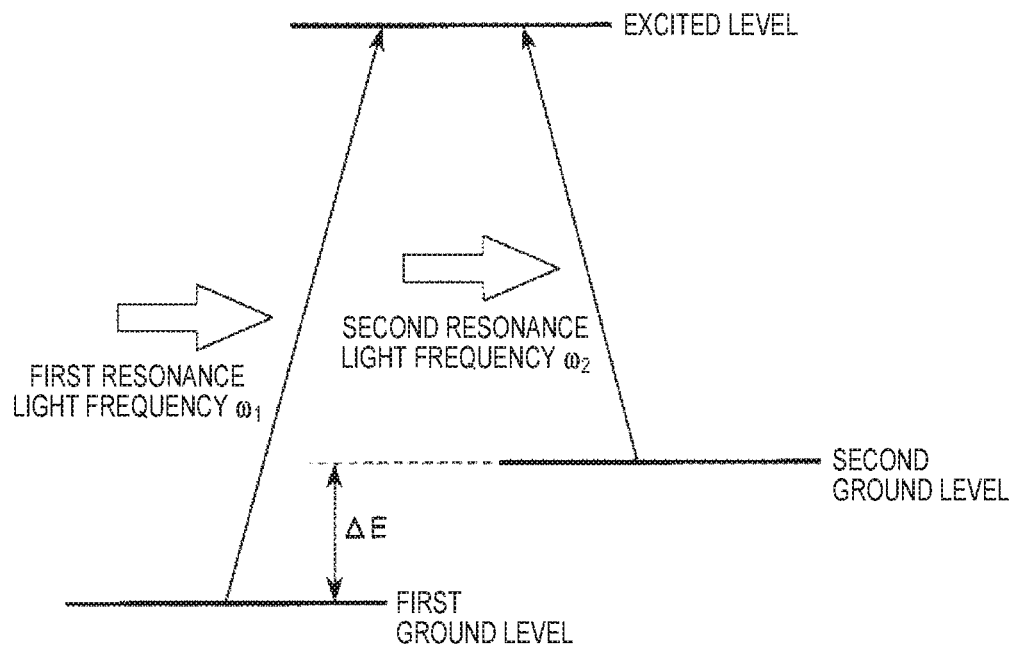
FIG. 2 is a diagram for schematically describing the energy state of an alkali metal atom.
Figure 3:
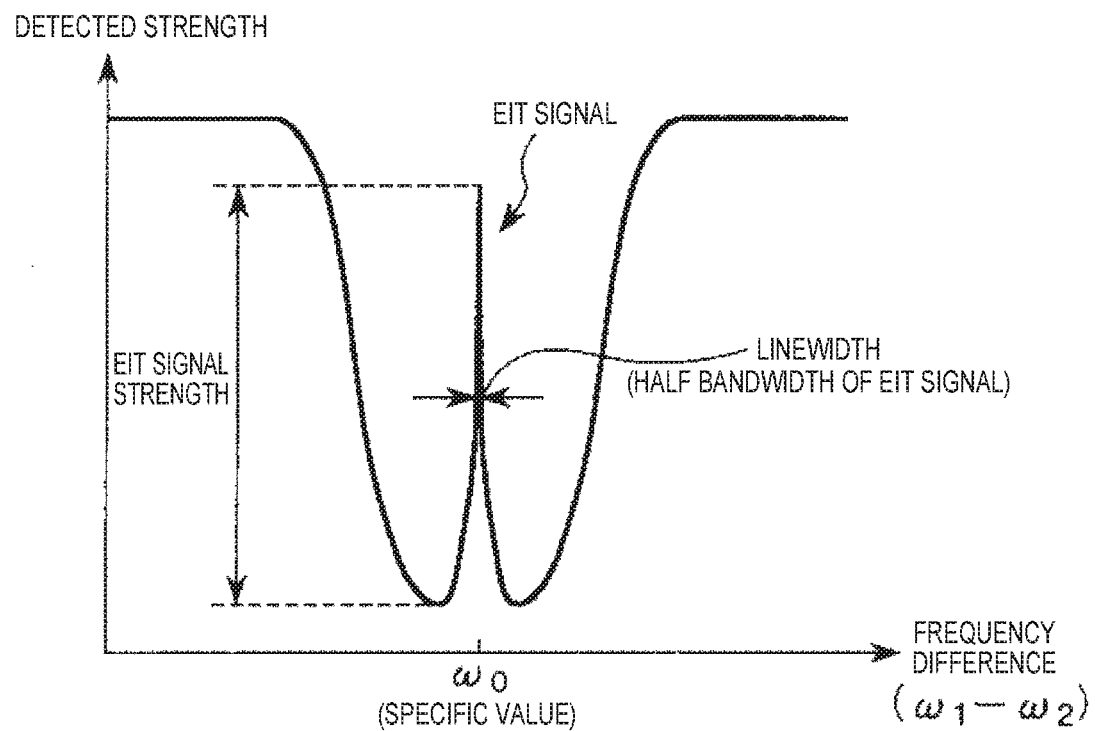
FIG. 3 is a graph showing a relationship between a difference in frequency between two types of light emitted from alight source section, and the intensity of the light detected in a light receiving section.

FIG. 1 is a schematic diagram showing the atomic oscillator (quantum interference device) according to the first embodiment of the invention. FIG. 2 is a diagram for schematically describing the energy state of an alkali metal atom. FIG. 3 is a graph showing a relationship between a difference in frequency between two types of light emitted from a light source section, and the intensity of the light detected in a light receiving section.

The atomic oscillator 1 shown in FIG. 1 is an atomic oscillator using coherent population trapping. As shown in FIG. 1, the atomic oscillator 1 is provided with an atom cell 2 (a gas cell), a light source section 3, a light receiving section 4, a heater 5, a temperature sensor 6, a magnetic field generation section 7, and a control section 8.

Firstly, the principle of the atomic oscillator 1 will briefly be described.

As shown in FIG. 1, in the atomic oscillator 1, the light source section 3 emits light LL toward the atom cell 2, and the light receiving section 4 detects the light LL having been transmitted through the atom cell 2.

In the atom cell 2, there is encapsulated gaseous alkali metal (metal atom). As shown in FIG. 2, the alkali metal has energy levels of a three level system formed of two ground levels (a first ground level and a second ground level) and an excited level. Here, the first ground level is an energy state lower than the second ground level.

The light LL emitted from the light source section 3 includes first resonance light and second resonance light as two types of resonance light different in frequency. When irradiating the gaseous alkali metal described above with the first resonance light and the second resonance light, the light absorptance (the light transmittance) of the first and second resonance light in the alkali metal varies in accordance with a difference $(\omega_1-\omega_2)$ between the frequency $\omega_1$ of the first resonance light and the frequency $\omega_2$ of the second resonance light.

Then, when the difference $(\omega_1-\omega_2)$ between the frequency $\omega_1$ of the first resonance light and the frequency $\omega_2$ of the second resonance light coincides with the frequency corresponding to the energy difference $\Delta E$ between the first ground level and the second ground level, the excitation from the first ground level and the second ground level to the excited level stops, respectively. On this occasion, both of the first resonance light and the second resonance light are transmitted without being absorbed by the alkali metal. Such a phenomenon is called a CPT phenomenon or electromagnetically induced transparency (EIT).

For example, in the case in which the light source section 3 fixes the frequency $\omega_1$ of the first resonance light and continues to vary the frequency $\omega_2$ of the second resonance light, the detection intensity of the light receiving section 4 rapidly rises as shown in FIG. 3 when the difference $(\omega_1-\omega_2)$ between the frequency $\omega_1$ of the first resonance light and the frequency $\omega_2$ of the second resonance light coincides with the frequency $\omega_0$ corresponding to the energy difference $\Delta E$ between the first ground level and the second ground level. Such a rapid signal as described above is detected as an EIT signal. The EIT signal has a characteristic value determined by the type of the alkali metal. Therefore, by using such an EIT signal as a reference, an oscillator high in accuracy can be configured.

Hereinafter, constituents of the atomic oscillator 1 will briefly be described.

Gas Cell

In the atom cell 2, there is encapsulated the alkali metal such as rubidium, cesium, or sodium in the form of a gas. Further, in the atom cell 2, as a buffer gas, a noble gas such as argon or neon, or an inert gas such as nitrogen can also be encapsulated together with the alkali metal gas if needed.

Although described later in detail, the atom cell 2 has a body part having a through hole, and a pair of window parts closing the openings of the through hole of the body part, and thus, there is formed an internal space in which the gaseous alkali metal is encapsulated.

Light Emitting Section

The light source section 3 has a function of emitting the light LL including the first resonance light and the second resonance light described above constituting the resonance light pair for resonating the alkali metal atoms in the atom cell 2.

Further, the light LL emitted by the light source section 3 includes third resonance light in addition to the first resonance light and the second resonance light.

The first resonance light is the light (probe light) for exciting the alkali metal atoms located inside the atom cell 2 from the first ground level described above to the excited level. In contrast, the second resonance light is the light (coupling light) for exciting the alkali metal atoms located inside the atom cell 2 from the second ground level described above to the excited level. Here, the first resonance light and the second resonance light are circularly polarized in the same direction as each other. Further, the third resonance light is the "adjustment light" (repump light) for adjusting the magnetic quantum number of the alkali metal located in the atom cell 2. The third resonance light is circularly polarized in the opposite direction to those of the first resonance light and the second resonance light. Thus, it is possible to adjust the magnetic quantum number of the alkali metal atoms located in the atom cell 2. It should be noted that the light source section 3 will be described later in detail. It should be noted that the "circularly polarized light" denotes the light, in which the vibration direction rotates at the frequency of the light wave in a plane perpendicular to the proceeding direction of the light in focusing attention on the vibration of either one of the electric field component and the magnetic field component of the light wave, and the amplitude of the vibration is constant irrespective of the direction, and in other words, the light in which the vibration of the electric field (or the magnetic field) draws a circle with the propagation.

Light Receiving Section

The light receiving section 4 has a function of detecting the intensity of the light LL (in particular the resonance light pair formed of the first resonance light and the second resonance light) having been transmitted through the atom cell 2.

The light receiving section 4 is not particularly limited as long as the intensity of such light LL as described above can be detected, and for example, a photo detector (a light receiving element) such as a photodiode for outputting a signal corresponding to the intensity of the light received can be used as the light receiving section 4. It should be noted that a configuration of the light receiving section 4 will be described later in detail.

Heater

The heater 5 (a heating section) has a function of heating the atom cell 2 (more specifically, the alkali metal in the atom cell 2) described above. Thus, the alkali metal located in the atom cell 2 can be kept in the form of a gas with an appropriate density.

The heater 5 is configured including, for example, a heating resistive element for generating heat in accordance with power distribution. The heating resistive element can be disposed so as to have contact with the atom cell 2, or can also be disposed so as not to have contact with the atom cell 2.

More specifically, in the case of disposing the heating resistive element so as to have contact with the atom cell 2, the heating resistive element is disposed on each of a pair of windows of the atom cell 2. Thus, it is possible to prevent the alkali metal atoms from condensing on the windows of the atom cell 2. As a result, the characteristics (the oscillation characteristics) of the atomic oscillator 1 can be made excellent for a long period of time. Such a heating resistive element is formed of a material having permeability with respect to the light LL, specifically a transparent electrode material such as an oxide such as ITO (indium tin oxide), IZO (indium zinc oxide), $In_3O_3$, $SnO_2$, Sb-doped $SnO_2$, or Al-doped ZnO. Further, such a heating resistive element can be formed using, for example, a chemical vapor deposition (CVD) such as a plasma CVD or a thermal CVD, a dry plating method such as a vacuum deposition, or a sol-gel method.

Further, in the case of disposing the heating resistive element so as not to have contact with the atom cell 2, it is sufficient to conduct the heat from the heating resistive element to the atom cell 2 via a member made of metal, ceramics, or the like superior in heat conductivity.

It should be noted that the heater 5 is not limited to the configuration described above as long as the atom cell 2 can be heated, and a variety of types of heaters can be used as the heater 5. Further, it is also possible to heat the atom cell 2 using a Peltier element instead of, or together with the heater 5.

Temperature Sensor

The temperature sensor 6 has a function of detecting the temperature of the heater 5 or the atom cell 2.

The temperature sensor 6 is disposed, for example, so as to have contact with the heater 5 or the atom cell 2.

The temperature sensor 6 is not particularly limited, and a variety of known temperature sensors such as a thermistor or a thermocouple can be used as the temperature sensor 6.

Magnetic Field Generation Section

The magnetic field generation section 7 has a function of applying a magnetic field to the alkali metal located in the atom cell 2. Thus, it is possible to enlarge the degenerate gaps between the energy levels different from each other of the alkali metal atom located in the atom cell 2 using the Zeeman split to thereby improve the resolution. As a result, the accuracy of the oscillation frequency of the atomic oscillator 1 can be improved.

Here, the magnetic field from the magnetic field generation section 7 is along (roughly parallel to) the proceeding direction of the light LL inside the atom cell 2. It should be noted that from a viewpoint of making the resonance light pair and the adjustment light efficiently act on the alkali metal located in the atom cell 2, the direction of the magnetic field from the magnetic field generation section 7 is preferably in a range of not smaller than 0° and not larger than 30°, more preferably in a range of not smaller than 0° and not larger than 20°, and further more preferably in a range of not smaller than 0° and not larger than 10° with respect to the proceeding direction of the light LL.

The magnetic field generation section 7 is formed of a coil disposed winding around the outer circumference of the atom cell 2 so as to constitute a solenoidal configuration. It should be noted that the magnetic field generation section 7 can also be constituted by a pair of coils disposed facing to each other across the atom cell 2 so as to constitute a Helmholtz configuration.

Further, the magnetic field generated by the magnetic field generation section 7 is a constant magnetic field (direct-current magnetic field), but can also be superimposed with an alternating-current magnetic field.

Control Section

The control section 8 has a function of controlling each of the light source section 3, the heater 5, and the magnetic field generation section 7.

The control section 8 has a light source control section 82 for controlling the light source section 3, a temperature control section 81 for controlling the temperature of the alkali metal in the atom cell 2, and a magnetic field control section 83 for controlling the magnetic field from the magnetic field generation section 7.

The light source control section 82 has a function of controlling the frequencies of the first resonance light and the second resonance light emitted from the light source section 3 based on the detection result of the light receiving section 4 described above. More specifically, the light source control section 82 controls the frequencies of the first resonance light and the second resonance light emitted from the light source section 3 so that the frequency difference ($\omega_1 - \omega_2$) described above becomes equal to the frequency $\omega_0$ inherent in the alkali metal described above. It should be noted that a configuration of the light source control section 82 will be described later in detail.

Further, the temperature control section 81 controls the power distribution to the heater 5 based on the detection result of the temperature sensor 6. Thus, the atom cell 2 can be kept within the desired temperature range. For example, the atom cell 2 is controlled in temperature by the heater 5 to, for example, around 70° C.

Further, the magnetic field control section 83 controls the power distribution to the magnetic field generation section 7 so that the magnetic field generated by the magnetic field generation section 7 becomes constant.

Such a control section 8 is disposed in, for example, an IC chip mounted on a board.

Hereinabove, the configuration of the atomic oscillator 1 is briefly described.

Detailed Description of Light Source Section, Atom Cell, and Aperture Member

Figure 4:
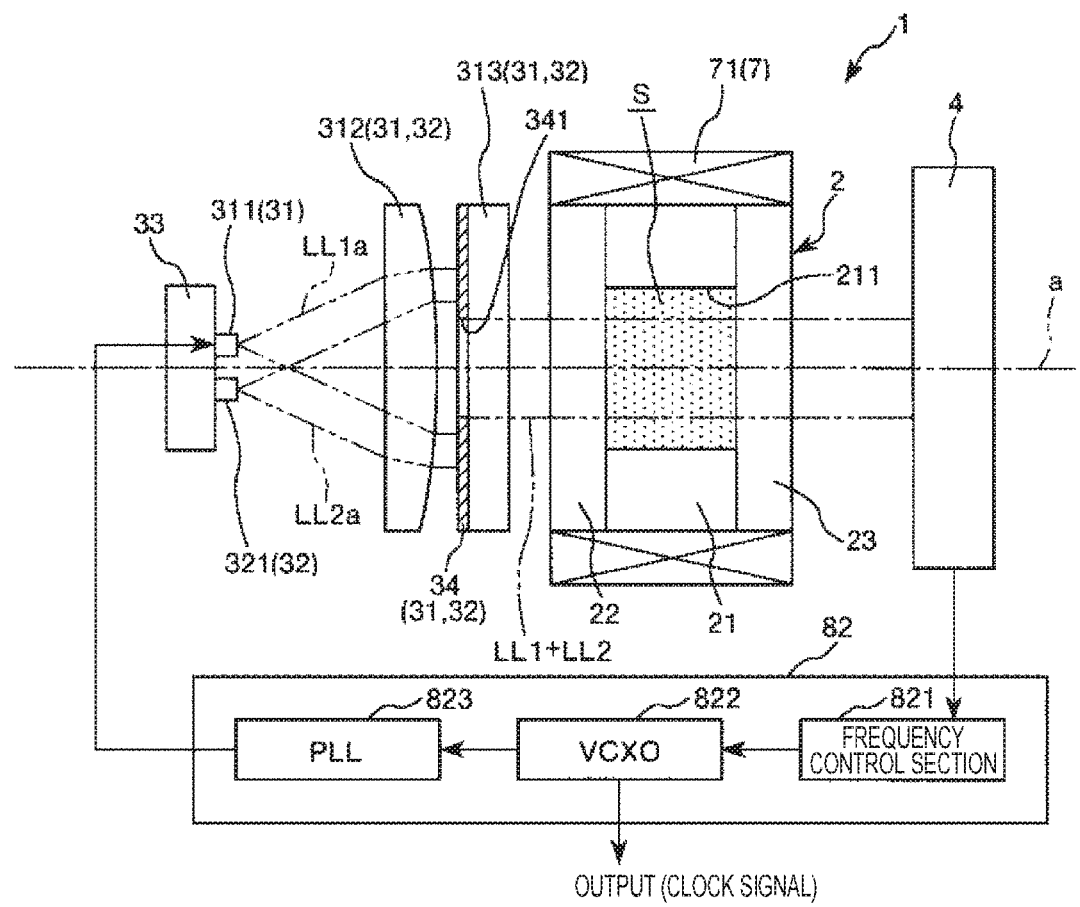
FIG. 4 is a schematic diagram for describing the light source section, an atom cell, and an aperture member provided to the atomic oscillator shown in FIG. 1.

FIG. 4 is a schematic diagram for describing the light source section, the atom cell, and an aperture member provided to the atomic oscillator shown in FIG. 1.

As shown in FIG. 4, the light source section 3 is provided with a first light source section 31 for emitting the resonance light pair LL1 formed of the first resonance light and the second resonance light as first light, and a second light source section 32 for emitting the adjustment light LL2 formed of the third resonance light as second light.

The first light source section 31 has a first light source 311 (a first light emitting element), a lens 312, a ¼ wave plate 313, and an aperture member 34. It should be noted that the first light source section 31 can also be provided with a ½ wave plate disposed between the first light source 311 and the ¼ wave plate 313. In this case, it is sufficient to dispose the first light source 311 with a posture rotated 90° around the optical axis.

The first light source 311 is disposed on the substrate 33 such as a silicon substrate. The first light source 311 has a function of emitting first light LL1a formed of resonance light pair as linearly polarized light. Here, the first light LL1a is emitted from the first light source 311 so as to spread with a predetermined radiation angle. The radiation angle is not particularly limited, but is preferably in a range of not smaller than 10° and not larger than 40°, and is more preferably in a range of not smaller than 15° and not larger than 30°. Thus, it is possible to efficiently irradiate the inside of the atom cell 2 with the resonance light pair LL1 in a state of being superimposed on the adjustment light LL2.

The first light source 311 is not particularly limited as long as the light including the first light LL1a can be emitted, but is a semiconductor laser such as an edge emitting laser or a vertical cavity surface emitting laser (VCSEL). It should be noted that the "linearly polarized light" is the light having the vibration plane of the magnetic wave (light) in a plane, in other words, the light in which the vibration direction of the electric field (or the magnetic field) is constant.

The lens 312 is disposed between the first light source 311 and the atom cell 2. Thus, it is possible to reduce the spread of the first light LL1a, which is emitted from the first light source 311 so as to spread with a predetermined radiation angle, to form, for example, parallel light, and as a result, to make the resonance light pair LL1 located in the atom cell 2 into parallel light.

The ¼ wave plate 313 is a birefringent element causing a phase difference of $\pi/2$ (90°) between the polarization components perpendicular to each other of the light having entered the ¼ wave plate 313. The ¼ wave plate 313 has a function of converting the first light LL1a emitted from the first light source 311 from the linearly polarized light into the resonance light pair LL1 as the circularly polarized light (including elliptically polarized light). Thus, it is possible to generate the resonance light pair LL1 formed of the first resonance light and the second resonance light described above.

The aperture member 34 is disposed on a surface on the first light source 311 side of the ¼ wave plate 313. The aperture member 34 has an opening 341 for transmitting the light in a partial region out of the light having entered the aperture member 34, and has a function of adjusting the width (diameter) and the shape of the light. In the first light source section 31, a part of the first light LL1a from the first light source 311 is transmitted through the opening 341, and thus, the width and the shape of the first light LL1a are adjusted. Here, a part of the aperture member 34 excluding the opening 341 is provided with a light blocking property. A constituent material of such an aperture member 34 is not particularly limited as long as the part of the aperture member 34 excluding the opening 341 can be provided with the light blocking property, and a resin material or a metal material, for example, can be used as the constituent material, and further, a material with which the part of the aperture member 34 excluding the opening 341 can prevent reflection of the light is preferable as the constituent material. Further, the method of forming the aperture member 34 is not particularly limited. In the case of the present embodiment, for example, the aperture member 34 can be formed on the ¼ wave plate 313 using a known film forming method.

As described above, the first light source section 31 emits the resonance light pair LL1 using the light from the first light source 311.

Meanwhile, the second light source section 32 has a second light source 321, the lens 312, the ¼ wave plate 313, and the aperture member 34. Here, the lens 312, the ¼ wave plate 313, and the aperture member 34 are disposed commonly to the first light source section 31 described above. In other words, it can be said that the lens 312, the ¼ wave plate 313, and the aperture member 34 are provided to the first light source section 31, and it can also be said that the lens 312, the ¼ wave plate 313, and the aperture member 34 are provided to the second light source section 32. It should be noted that the second light source section 32 can also be provided with a ½ wave plate disposed between the second light source 321 and the ¼ wave plate 313. In this case, it is sufficient to dispose the second light source 321 with a posture rotated 90° around the optical axis.

The second light source 321 is disposed on the same substrate 33 as that of the first light source 311. The second light source 321 has a function of emitting second light LL2a formed of resonance light linearly polarized in a direction perpendicular to the direction of the linearly polarized light of the first light source 311. Here, the second light LL2a is emitted from the second light source 321 so as to spread with a predetermined radiation angle. The radiation angle is not particularly limited, but is preferably equivalent to or slightly larger than the radiation angle of the first light LL1a in the first light source 311, and specifically, the radiation angle is preferably in a range of not smaller than 10° and not larger than 50°, and more preferably in a range of not smaller than 15° and not larger than 40°. Thus, it is possible to efficiently irradiate the inside of the atom cell 2 with the adjustment light LL2 in a state of being superimposed on the resonance light pair LL1.

The second light source 321 is not particularly limited as long as the light including the second light LL2a can be emitted, but is a semiconductor laser such as an edge emitting laser or a vertical cavity surface emitting laser (VCSEL), or a light emitting element such as a light emitting diode (LED), or an organic electroluminescence (organic EL).

Here, the output (the intensity of the second light LL2a) of the second light source 321 is preferably lower than the output (the intensity of the first light LL1a) of the first light source 311. Thus, it is possible to efficiently cause such a function by the adjustment light as described later.

The lens 312 is disposed between the second light source 321 and the atom cell 2. Thus, it is possible to make the second light LL2a from the second light source 321 into parallel light, and as a result, it is possible to make the adjustment light LL2 located in the atom cell 2 into parallel light.

The ¼ wave plate 313 has a function of converting the second light LL2a, which has been emitted from the second light source 321, from the linearly polarized light into the adjustment light LL2 as the circularly polarized light (including elliptically polarized light). Thus, it is possible to generate the adjustment light LL2 to be the third resonance light described above. Here, the polarization direction of the second light LL2a polarized linearly is a direction different from (direction perpendicular to) the polarization direction of the first light LL1a polarized linearly. Therefore, in the casein which the resonance light pair LL1 having been generated by the ¼ wave plate 313 is right-handed circularly polarized light, the adjustment light LL2 generated by the ¼ wave plate 313 is left-handed circularly polarized light, and in contrast, in the case in which the resonance light pair LL1 is left-handed circularly polarized light, the adjustment light LL2 is right-handed circularly polarized light. By irradiating the atom cell 2 with such resonance light pair LL1 and such adjustment light LL2 circularly polarized in the rotational directions opposite to each other as described above from the same side as each other, the rotational direction of the circularly polarized light as the adjustment light LL2 becomes the opposite direction to the rotational direction of the circularly polarized light as the resonance light pair LL1 in the atom cell 2 when viewed from the same direction along the direction in which the window part 22 and the window part 23 of the atom cell 2 are arranged.

In the second light source section 32, a part of the second light LL2a from the second light source 321 is transmitted through the opening 341, and thus, the width and the shape of the second light LL2a are adjusted. Here, when viewed from the direction along an axis line a, it is preferable for the opening 341 to be included in the area where the first light LL1a and the second light LL2a are superimposed on each other on a plane along the aperture member 34. Thus, it is possible to uniform the transmission areas of the first light LL1a and the second light LL2a having been transmitted through the aperture member 34 with each other (to make the transmission areas into areas coinciding with or similar to each other).

As described above, the second light source section 32 emits the adjustment light LL2 using the light from the second light source 321.

In the light source section 3 configured in such a manner as described above, the first light source 311 is controlled by the light source control section 82 so as to emit the first resonance light and the second resonance light described above.

The light source control section 82 has a frequency control section 821, voltage controlled crystal oscillators 822 (VCXO), and a phase synchronization circuit (a phase locked loop (PLL)) 823.

The frequency control section 821 detects the EIT state in the atom cell 2 based on the received light intensity of the light receiving section 4 to output a control voltage corresponding to the detection result. Thus, the frequency control section 821 controls the voltage controlled crystal oscillator 822 so that the EIT signal is detected by the light receiving section 4.

The voltage controlled crystal oscillator 822 is controlled by the frequency control section 821 to oscillate at a predetermined oscillation frequency, and oscillates at a frequency of, for example, about several megahertz through several tens of megahertz. Further, the output signal of the voltage controlled crystal oscillator 822 is input to the phase synchronization circuit 823, and at the same time, output as the output signal of the atomic oscillator 1.

The phase synchronization circuit 823 multiplies the frequency of the output signal from the voltage controlled crystal oscillator 822. Thus, the phase synchronization circuit 823 oscillates at a frequency a half as high as the frequency corresponding to the energy difference ΔE between the two ground levels different from each other of the alkali metal atom described above. The signal (the high-frequency signal) multiplied in such a manner as described above is input to the first light source 311 of the first light source section 31 as the drive signal after the direct-current bias current is overlapped on the signal thus multiplied. Thus, it is possible to modulate the light emitting element such as a semiconductor laser included in the first light source 311 to make the light emitting element emit the first resonance light and the second resonance light as the two types of light having the frequency difference ($\omega_1 - \omega_2$) equal to $\omega_0$. Here, the current value of the direct-current bias current is controlled by a bias control section not shown to a predetermined value. Thus, it is possible to control the central wavelength of the first resonance light and the second resonance light as desired.

It should be noted that the first light source 311 and the second light source 321 are each adjusted in temperature to a predetermined temperature using a temperature control element (e.g., a heating resistive element or a Peltier element) not shown. Further, by controlling the temperature of the first light source 311 and the second light source 321, it is also possible to control the central wavelength of the light from the first light source 311 and the second light source 321.

The atom cell 2 is irradiated with the resonance light pair LL1 and the adjustment light LL2 from the first light source section 31 and the second light source section 32 configured in such a manner as explained hereinabove.

As shown in FIG. 4, the atom cell 2 has the body section 21, and the pair of window parts 22, 23 disposed across the body part 21 from each other. In the atom cell 2, the body part 21 is disposed between the pair of window parts 22, 23, and the body part 21 and the pair of window parts 22, 23 compartment (form) an internal space S in which the gaseous alkali metal is encapsulated.

In the more specific explanation, the body part 21 has a plate-like shape, and the body part 21 is provided with the through hole 211 penetrating the body part 21 in the thickness direction.

The constituent material of the body part 21 is not particularly limited, and there can be cited a glass material, a quartz crystal, a metal material, a resin material, a silicon material, and so on as the constituent material of the body part 21. Among these materials, either of the glass material, the quartz crystal, and the silicon material is preferably used, and the silicon material is further preferably used. Thus, even in the case of forming a small atom cell 2 with the width and the height equal to or smaller than 10 mm, it is possible to easily form the body part 21 high in accuracy using a microfabrication technology such as etching. In particular, the microfabrication by etching can be performed on silicon. Therefore, by forming the body part 21 using silicon, even in the case of achieving miniaturization of the atom cell 2, the body part 21 can easily and accurately be formed. Further, although the window parts 22, 23 are generally formed of glass, silicon is superior in thermal conductivity compared to glass. Therefore, it is possible to make the heat radiation property of the body part 21 excellent. Further, in the case in which the window parts 22, 23 are formed of glass, the body part 21 and the window parts 22, 23 can airtightly be bonded to each other with ease using anodic bonding, and thus the reliability of the atom cell 2 can be made excellent.

To one surface of such a body part 21, there is bonded the window part 22, and on the other hand, to the other surface of the body part 21, there is bonded the window part 23. Thus, one end opening of the through hole 211 is blocked by the window part 22, and at the same time, the other end opening of the through hole 211 is blocked by the window part 23.

The bonding method between the body part 21 and the window parts 22, 23 is determined in accordance with the constituent materials of these parts, and is not particularly limited as long as the body part 21 and the window parts 22, 23 can airtightly be bonded to each other. As the bonding method, there can be used, for example, a bonding method using an adhesive, a direct bonding method, an anodic bonding method, and a surface activated bonding method, and the direct bonding method or the anodic bonding method is preferably used. Thus, the body part 21 and the window parts 22, 23 can airtightly be bonded to each other with ease, and the reliability of the atom cell 2 can be made excellent.

The window parts 22, 23 bonded to such a body part 21 each have a plate-like shape, and have permeability with respect to the light LL from the light source part 3 described above. Further, one of the window parts, namely the window part 22, is an incident side window part through which the resonance light pair LL1 and the adjustment light LL2 enter the internal space S of the atom cell 2, and the other of the window parts, namely the window part 23, is an exit side window part through which the resonance light pair LL1 and the adjustment light LL2 are emitted from the internal space S of the atom cell 2.

The constituent material of the window parts 22, 23 is not particularly limited as long as the constituent material has such permeability with respect to the light LL as described above, and as the constituent material of the window parts 22, 23, there can be cited, for example, a glass material and a quartz crystal, and the glass material is preferably used. Thus, there can be realized the window parts 22, 23 having the permeability with respect to the excitation light. Further, in the case in which the body part 21 is formed of silicon, by forming the window parts 22, 23 using glass, the body part 21 and the window parts 22, 23 can airtightly be bonded to each other with ease using anodic bonding, and thus the reliability of the atom cell 2 can be made excellent. It should be noted that depending on the thickness of the window parts 22, 23 and the intensity of the light LL, the window parts 22, 23 can be formed of silicon. Even in this case, the body part 21 and the window parts 22, 23 can directly or anodically be bonded to each other.

In the internal space S, which is a space in the through hole 211 blocked by such window parts 22, 23, there is mainly housed the gaseous alkali metal. The gaseous alkali metal housed in the internal space S is excited by the light LL. Here, at least part of the internal space S constitutes a "light passing space" through which the light LL passes.

Further, on the outer circumference of the atom cell 2 configured in such a manner, there is disposed the coil 71 as a solenoidal coil provided to the magnetic field generation section 7.

In the atom cell 2 configured in such a manner as explained hereinabove, it is preferable for the passing area of the resonance light pair LL1 to coincide with or to be included in the passing area of the adjustment light LL2. In the present embodiment, in the atom cell 2, the respective light axes of the resonance light pair LL1 and the adjustment light LL2 are parallel to the axis line a along the direction in which the window part 22 and the window part 23 of the atom cell 2 are arranged. Thus, it is possible to make the passing areas of the resonance light pair LL1 and the adjustment light LL2 having passed through the aperture member 34 coincide with each other. It should be noted that if it is possible to make the passing area of the resonance light pair LL1 coincide with or approximate to the passing area of the adjustment light LL2 in the atom cell 2, the respective light axes of the resonance light pair LL1 and the adjustment light LL2 are allowed to be tilted with respect to the axis line a.

Here, on the side of the atom cell 2 from which the resonance light pair LL1 and the adjustment light LL2 are emitted, the light receiving section 4 described above is disposed on the axis line a or the extension of the axis line, and the resonance light pair LL1 having passed through the atom cell 2 is received by the light receiving section 4. In contrast, it is preferable for the adjustment light LL2 having passed through the atom cell 2 not to be received by the light receiving part 4. From such a viewpoint, it is possible to dispose a filter for preventing the passage of the adjustment light LL2 while allowing the passage of the resonance light pair LL1 between the atom cell 2 and the light receiving section 4. As such a filter, there can be cited, for example, a device having a ¼ wave plate and a polarizer arranged in this order from the atom cell 2 side toward the light receiving section 4 side.

Figure 5:
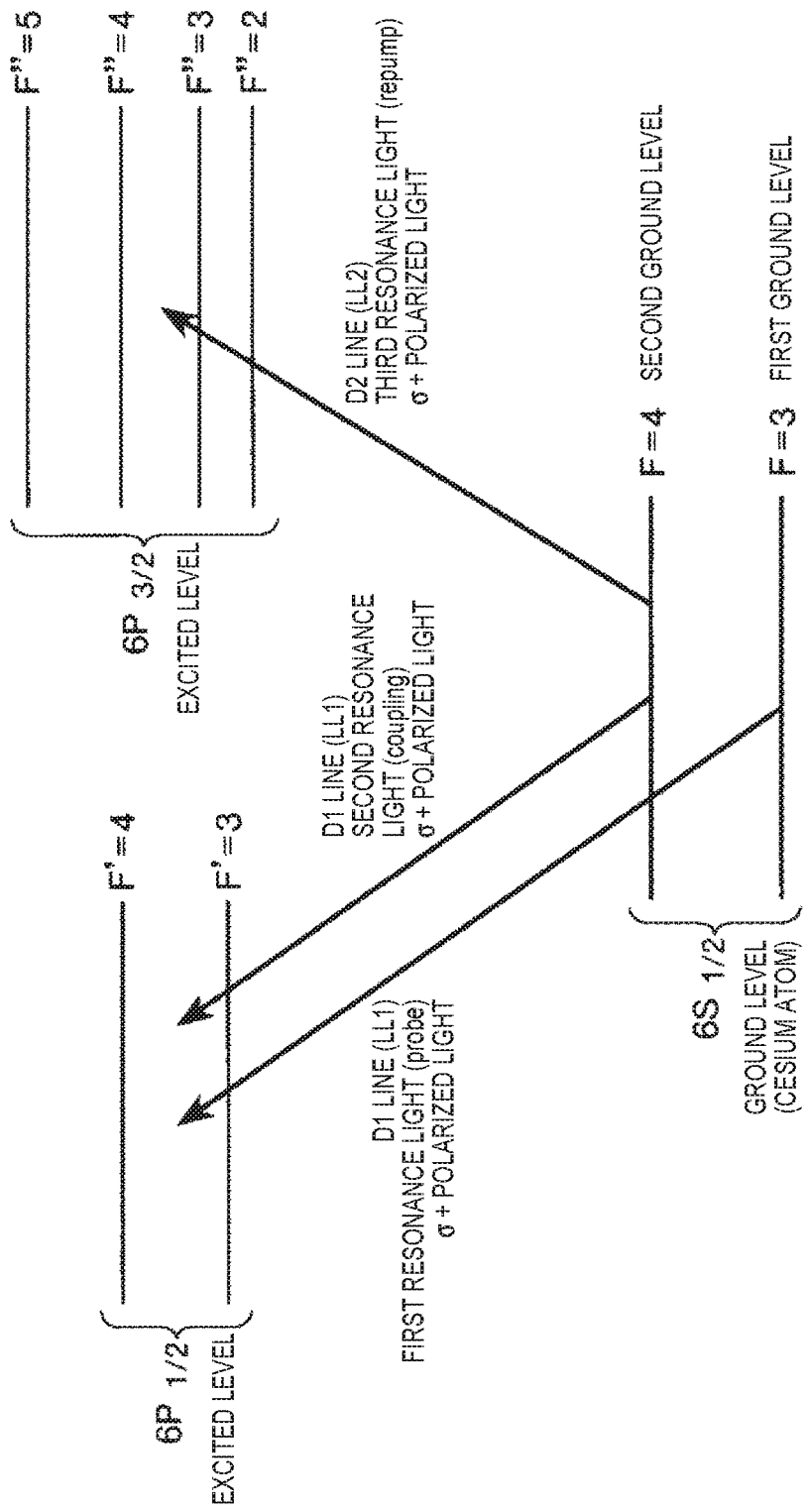
FIG. 5 is a diagram showing an example of a relationship between the energy state of a cesium atom, and a resonance light pair (first resonance light, second resonance light) and adjustment light (third resonance light).
Figure 6:
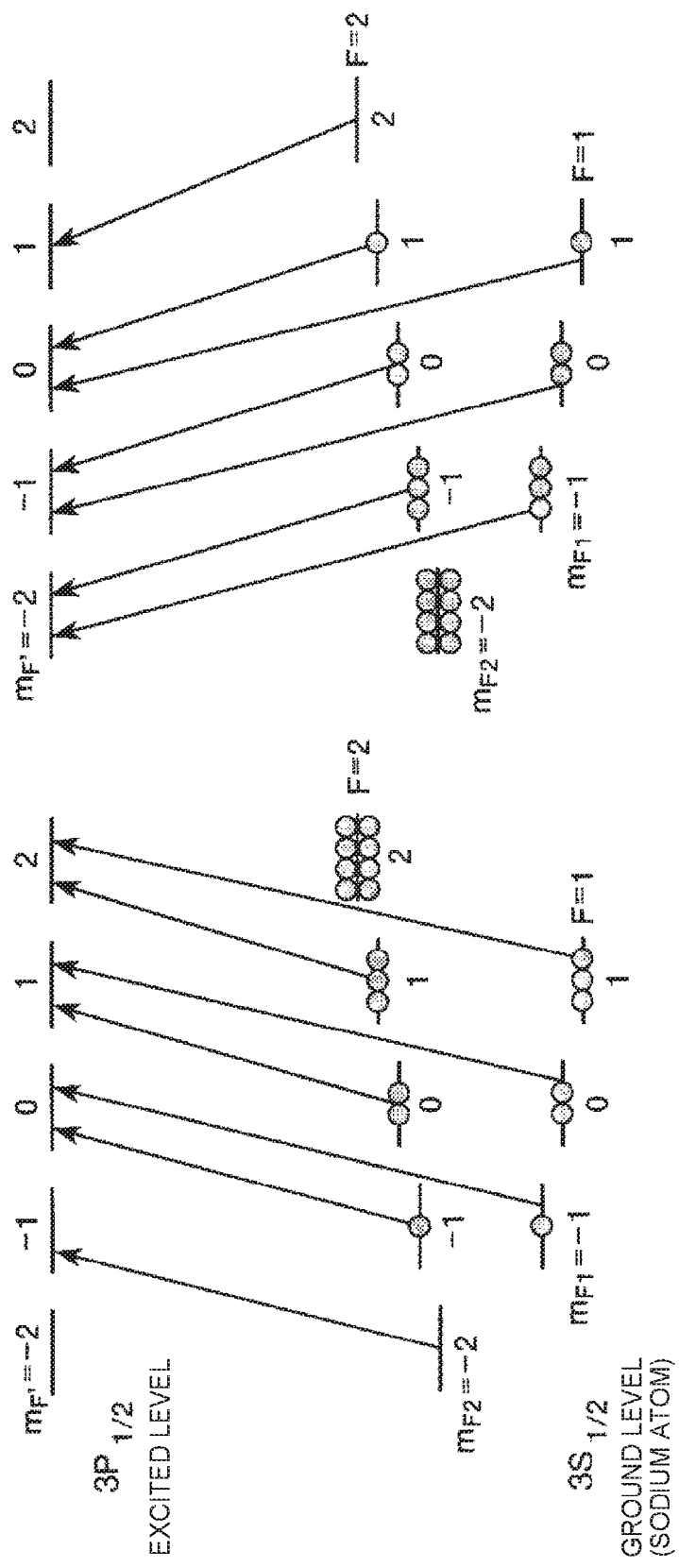

FIG. 5 is a diagram showing an example of a relationship between the energy state of a cesium atom, and the resonance light pair (the first resonance light, the second resonance light) and the adjustment light (the third resonance light). FIGS. 6A and 6B are diagrams each showing a distribution of the magnetic quantum number of a sodium atom, wherein FIG. 6A is a diagram showing the distribution in the case of being irradiated with the resonance light as $\sigma_+$ circularly polarized light, and FIG. 6B is a diagram showing the distribution in the case of being irradiated with the resonance light as $\sigma_-$ circularly polarized light. The function of the resonance light pair and the adjustment light in such a case will hereinafter be described based on FIGS. 5, 6A, and 6B.

In the case in which, for example, the cesium atoms are encapsulated in the atom cell 2, and are irradiated with the resonance light pair and the adjustment light from the same direction, the D1 line, which is $\sigma_+$-polarized (left-handed circularly polarized), is used as the first resonance light and the second resonance light (the resonance light pair), and the D2 line, which is $\sigma_-$-polarized (right-handed circularly polarized), is used as the third resonance light (the adjustment light) as shown in FIG. 5. It should be noted that it is possible to arrange that the first resonance light and the second resonance light are each the $\sigma_-$-polarized light, and the third resonance light is the $\sigma_+$-polarized light, or it is possible to arrange that the first resonance light and the second resonance light are each the D2 line, and the third resonance light is the D1 line.

The cesium atom, which is a kind of the alkali metal atom, has the ground level of $6S_{1/2}$, and the two excited levels of $6P_{1/2}$ and $6P_{3/2}$. Further, each of the levels of $6S_{1/2}$, $6P_{1/2}$ and $6P_{3/2}$ has a microstructure of being split into a plurality of energy levels. Specifically, the level of $6S_{1/2}$ has two ground levels of F=3, 4, the level of $6P_{1/2}$ has two excited levels of F'=3, 4, and the level of $6P_{3/2}$ has four excited levels of F'''=2, 3, 4, and 5.

The cesium atom in the first ground level of F=3 in $6S_{1/2}$ can make the transition to the excited level of either one of F'''=2, 3, and 4 in $6P_{3/2}$ by absorbing the D2 line, but cannot make the transition to the excited level of F'''=5. The cesium atom in the second ground level of F=4 in $6S_{1/2}$ can make the transition to the excited level of either one of F'''=3, 4, and 5 in $6P_{3/2}$ by absorbing the D2 line, but cannot make the transition to the excited level of F'''=2. These are derived from the transition selection rule in the case of assuming the electric dipole transition. By contraries, the cesium atom in the excited level of either one of F'''=3, 4 in $6P_{3/2}$ can make the transition to the ground level (either one of the original ground level and the other ground level) of F=3 or F=4 in $6S_{1/2}$ by releasing the D2 line. Three levels consisting of the two ground levels of F=3, 4 in $6S_{1/2}$ and the excited level of either one of F'''=3, 4 in $6P_{3/2}$ described above are called Λ-type three levels since Λ-type transition due to absorption/emission of the D2 line can be made. Similarly, three levels consisting of the two ground levels of F=3, 4 in $6S_{1/2}$ and the excited level of either one of F'=3, 4 in $6P_{1/2}$ also form the Λ-type three levels since the Λ-type transition due to absorption/emission of the D1 line can be made.

In contrast, the cesium atom in the excited level of F'''=2 in $6P_{3/2}$ releases the D2 line to inevitably make the transition to the ground level (the original ground level) of F=3 in $6S_{1/2}$, and in a similar manner, the cesium atom in the excited level of F'''=5 in $6P_{3/2}$ releases the D2 line to inevitably make the transition to the ground level (the original ground level) of F=4 in $6S_{1/2}$. Therefore, the three levels consisting of the two ground levels of F=3, 4 in $6S_{1/2}$ and the excited level of either one of F'''=2 and F'''=5 in $6P_{3/2}$ do not form the Λ-type three levels since the Λ-type transition due to absorption/emission of the D2 line cannot be made.

In such a cesium atom, the wavelength of the D1 line in vacuum is 894.593 nm, the wavelength of the D2 line in vacuum is 852.347 nm, and the hyperfine splitting frequency (ΔE) of $6S_{1/2}$ is 9.1926 GHz.

It should be noted that the alkali metal atoms other than the cesium atoms also have two ground levels and an excited level constituting the Λ-type three levels in a similar manner. Here, in a sodium atom, the wavelength of the D1 line in vacuum is 589.756 nm, the wavelength of the D2 line in vacuum is 589.158 nm, and the hyperfine splitting frequency (ΔE) of $3S_{1/2}$ is 1.7716 GHz. Further, in a rubidium ($^{85}$Rb) atom, the wavelength of the D1 line in vacuum is 794.979 nm, the wavelength of the D2 line in vacuum is 780.241 nm, and the hyperfine splitting frequency (ΔE) of $5S_{1/2}$ is 3.0357 GHz. Further, in a rubidium ($^{87}$Rb) atom, the wavelength of the D1 line in vacuum is 794.979 nm, the wavelength of the D2 line in vacuum is 780.241 nm, and the hyperfine splitting frequency (ΔE) of $5S_{1/2}$ is 6.8346 GHz.

For example, as shown in FIGS. 6A and 6B, the sodium atom, which is a kind of the alkali metal atom, has the two ground levels and the excited level constituting the Λ-type three levels, the first ground level of F=1 in $3S_{1/2}$ has three magnetic quantum numbers of $m_{F1}$=−1, 0, and 1, the second ground level of F=2 in $3S_{1/2}$ has five magnetic quantum numbers of $m_{F2}$=−2, −1, 0, 1, and 2, and the excited level of F'=2 in $3P_{1/2}$ has five magnetic quantum numbers of $m_{F'}$, =−2, −1, 0, 1, and 2.

When irradiating the sodium atom in the ground level of F=1 or F=2 with the resonance light pair as the $\sigma_+$ circularly polarized light, the sodium atom is excited to the excited level under the selection rule that the magnetic quantum number is incremented by one as shown in FIG. 6A. On this occasion, in the sodium atoms in the ground level of F=1 or F=2, the distribution changes toward the large magnetic quantum number.

In contrast, when irradiating the sodium atom in the ground level of F=1 or F=2 with the resonance light pair as the $\sigma_-$ circularly polarized light, the sodium atom is excited to the excited level under the selection rule that the magnetic quantum number is decremented by one as shown in FIG. 6B. On this occasion, in the sodium atoms in the ground level of F=1 or F=2, the distribution changes toward the small magnetic quantum number.

It should be noted that in FIGS. 6A and 6B, although the distribution of the magnetic quantum number is shown citing the sodium atom simple in structure as an example for the sake of convenience of explanation, in other alkali metal atoms, each of the ground levels and the excited level has 2F+1 magnetic quantum numbers (magnetic sublevels), and the distribution of the magnetic quantum number changes under the selection rule as described above.

As explained hereinafter, in the case of irradiating the alkali metal located in the atom cell 2 with the resonance light pair and the adjustment light from the same direction, by using the right-handed circularly polarized light as one of the resonance light pair and the adjustment light, and using the left-handed circularly polarized light as the other, the bias of the magnetic quantum number of the alkali metal can be reduced.

In the atomic oscillator 1 explained hereinabove, by irradiating the alkali metal with the resonance light pair LL1 circularly polarized in the same direction as each other, and the adjustment light LL2 circularly polarized in the rotational direction opposite to that of the resonance light pair LL1 in the atom cell 2, the bias in the distribution of the magnetic quantum number due to the resonance light pair LL1 can be canceled out or reduced by the adjustment light LL2 to thereby reduce the bias in the distribution of the magnetic quantum number of the alkali metal. Therefore, the number of the alkali metal atoms having the desired magnetic quantum number making a contribution to the EIT is increased, and as a result, the advantage of increasing the strength of the EIT signal is markedly developed by using the resonance light pair LL1 circularly polarized, and thus, it is possible to effectively increase the strength of the EIT signal.

Here, since the aperture member 34 having the opening 341 is disposed between the internal space S, and the first light source 311 (the first light emitting element) and the second light source 321 (the second light emitting element), the passing areas of the resonance light pair LL1 (first light) and the adjustment light LL2 (second light) entering the internal space S of the atom cell 2 can be made to coincide with or approximate to each other. Therefore, the bias in the distribution of the magnetic quantum number of the alkali metal can efficiently be reduced. More specifically, in the atom cell 2, it is possible to achieve homogenization of the light intensity density (power density) in the respective width directions of the resonance light pair LL1 and the adjustment light LL2, and at the same time, to reduce the area through which only either one of the resonance light pair LL1 and the adjustment light LL2 passes. Therefore, the balance between the resonance light pair LL1 and the adjustment light LL2 can be made excellent, and thus, the strength of the EIT signal can be increased while decreasing the linewidth of the EIT signal.

Moreover, since in the present embodiment, the lens 312 is disposed between the first light source 311 and the second light source 321, and the aperture member 34, each of the resonance light pair LL1 and the adjustment light LL2 entering the internal space S of the atom cell 2 can be made into parallel light. Therefore, it is possible to reduce the chance for the power density of the resonance light pair LL1 and the adjustment light LL2 to vary in the proceeding direction (a propagating direction) in the internal space S of the atom cell 2 to thereby efficiently reduce the bias in the distribution of the magnetic quantum number of the alkali metal. As a result, it is possible to increase the strength of the EIT signal while narrowing the linewidth of the EIT signal.

In contrast, since the first light source 311 and the second light source 321 are disposed at respective positions different from each other on the same substrate 33, if the aperture member 34 is eliminated, the area through which only the resonance light pair LL1 or only the adjustment light LL2 passes is apt to increase in the internal space S of the atom cell 2. Therefore, in the case in which the first light source 311 and the second light source 321 are disposed on the same substrate 33, the advantage obtained by disposing the aperture member 34 becomes conspicuous.

Further, as described above, the first light source section 31 and the second light source section 32 are commonly provided with the ¼ wave plate 313 disposed between the first light source 311 and the second light source 321, and the internal space S. Thus, it is possible to respectively generate the resonance light pair LL1 from the first light source section 31, and the adjustment light LL2 from the second light source section 32 while reducing the number of components constituting the first light source section 31 and the second light source section 32.

In the present embodiment, since the aperture member 34 is disposed between the first light source 311 and the second light source 321, and the ¼ wave plate 313, it is possible to reduce the chance for the light failing to enter the opening 341 of the aperture member 34 to be reflected by the ¼ wave plate 313 to exert a harmful influence.

Further, since the aperture member 34 is disposed on the ¼ wave plate 313, the aperture member 34 and the ¼ wave plate 313 can be disposed in a lump, and thus, manufacturing of the atomic oscillator 1 becomes easy.

Further, in the case in which one of the resonance light pair LL1 and the adjustment light LL2 is the D1 line, and the other is the D2 line, it is possible to efficiently cause the EIT phenomenon, and as a result, it is possible to efficiently increase the strength of the EIT signal.

Further, it is preferable that the intensity (the photon flux density) of the adjustment light LL2 is lower than that of the resonance light pair LL1 in the atom cell 2. Thus, the bias in the magnetic quantum number of the alkali metal in the atom cell 2 can efficiently be reduced.

Further, if the intensity of the adjustment light LL2 is too high, the distribution of the magnetic quantum number of the alkali metal in the atom cell 2 is dramatically biased toward the opposite side to the bias in the distribution of the magnetic quantum number due to the resonance light pair LL1 in some cases. In contrast, if the intensity of the adjustment light LL2 is too low, the bias in the distribution of the magnetic quantum number due to the resonance light pair LL1 cannot sufficiently be canceled out or reduced by the adjustment light LL2 in some cases.

From such a viewpoint, in the case in which the photon flux density of the resonance light pair LL1 in the atom cell 2 is denoted by D1, and the photon flux density of the adjustment light LL2 in the atom cell 2 is denoted by D2, D2/D1 is preferably not lower than 0.1 and not higher than 0.9, more preferably not lower than 0.2 and not higher than 0.7, and further more preferably not lower than 0.3 and not higher than 0.5.

Further, in the case in which the first light source 311 is a surface emitting laser, the resonance light pair LL1 having a desired frequency can easily be generated. Further, since the surface emitting laser emits the light spreading with a predetermined radiation angle, it is possible to easily superimpose the light from the first light source 311 and the light from the second light source 321 on each other to make the result enter the aperture member 34.

Similarly, in the case in which the second light source 321 is a surface emitting laser, the adjustment light LL2 having a desired frequency can easily be generated. Further, since the surface emitting laser emits the light spreading with a predetermined radiation angle, it is possible to easily superimpose the light from the first light source 311 and the light from the second light source 321 on each other to make the result enter the aperture member 34.

Further, in the case in which the second light source 321 is a light emitting diode, the linewidth of the adjustment light LL2 can be made larger than that of the resonance light pair LL1. Therefore, it is possible to resonate the adjustment light LL2 with respect to the alkali metal atom broad in velocity distribution. Therefore, if the central wavelength of the adjustment light LL2 has some minor deviations, it is possible to resonate the adjustment light LL2 with respect to the alkali metal atom at a desired velocity. As a result, the frequency control of the adjustment light LL2 becomes unnecessary, and the device configuration can be simplified. Further, since the light emitting diode emits the light spreading with a predetermined radiation angle, it is possible to easily superimpose the light from the first light source 311 and the light from the second light source 321 on each other to make the result enter the aperture member 34.

Second Embodiment

Then, a second embodiment of the invention will be described.

Figure 7:
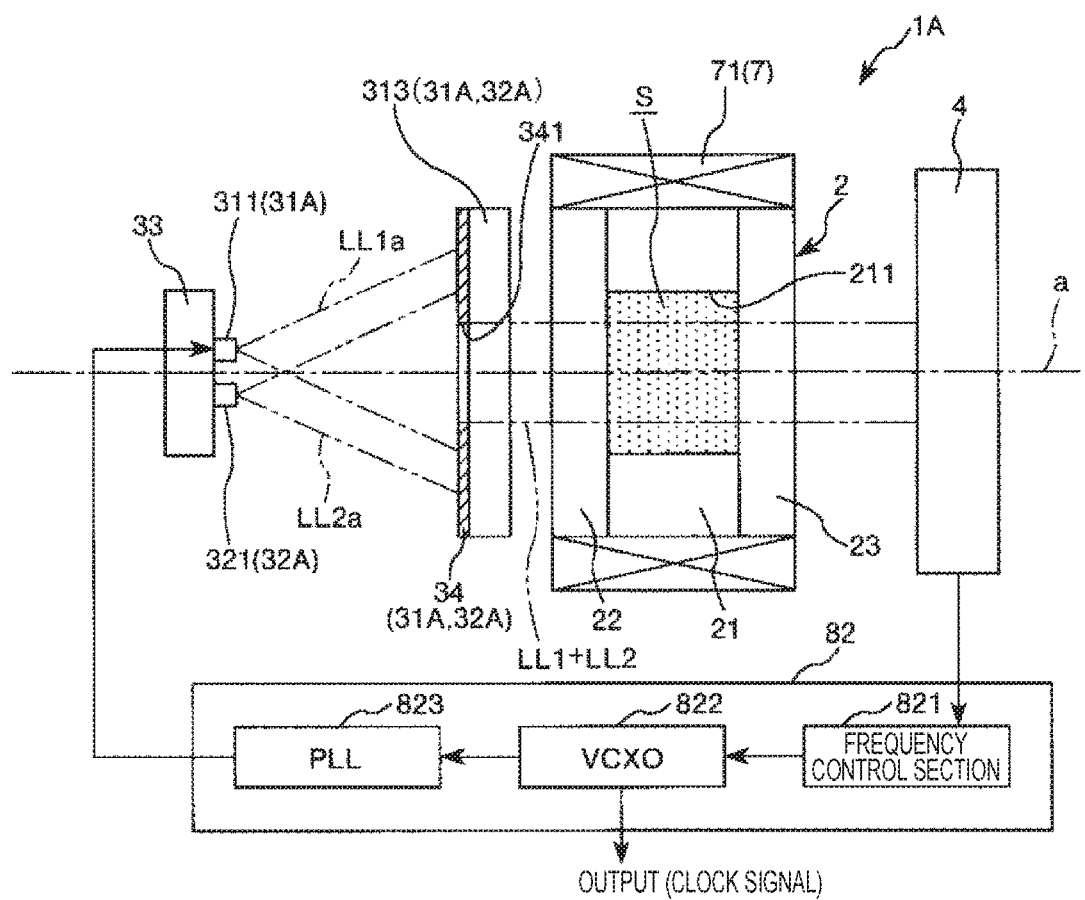
FIG. 7 is a schematic diagram for describing the light source section, an atom cell, and an aperture member provided to an atomic oscillator according to a second embodiment of the invention.

FIG. 7 is a schematic diagram for describing the light source section, an atom cell, and an aperture member provided to an atomic oscillator according to the second embodiment of the invention.

The present embodiment is substantially the same as the first embodiment described above except the point that the lens disposed between the first light emitting element and the second light emitting element is omitted, and the atom cell is omitted.

It should be noted that in the description below, the second embodiment will be described with a focus on the difference from the embodiment described above, and the description of substantially the same issues will be omitted. Further, in FIG. 7, the constituents substantially identical to those of the embodiment described above are denoted by the same reference symbols.

The atomic oscillator 1A shown in FIG. 7 is substantially the same as the atomic oscillator 1 according to the first embodiment except the point that the lens 312 of the first embodiment described above is omitted. In other words, the atomic oscillator 1A is provided with a first light source section 31A constituted by the first light source 311, the ¼ wave plate 313, and the aperture member 34, and a second light source section 32A constituted by the second light source 321, the ¼ wave plate 313, and the aperture member 34.

In such an atomic oscillator 1A, by eliminating the lens 312, miniaturization can be achieved. Here, the light from the first light source 311 and the light from the second light source 321 enter the aperture member 34 while spreading. Further, although not shown in the drawings, in reality, the resonance light pair LL1 and the adjustment light LL2 also pass through the atom cell 2 while spreading. Therefore, the power densities of the resonance light pair LL1 and the adjustment light LL2 vary in the proceeding direction in the atom cell 2. In order to reduce the influence of such a variation in the power density, it is sufficient to decrease the length in the direction along the axis line a of the atom cell 2.

According also to the second embodiment explained hereinabove, the strength of the EIT signal can effectively be increased.

Third Embodiment

Then, a third embodiment of the invention will be described.

Figure 8:
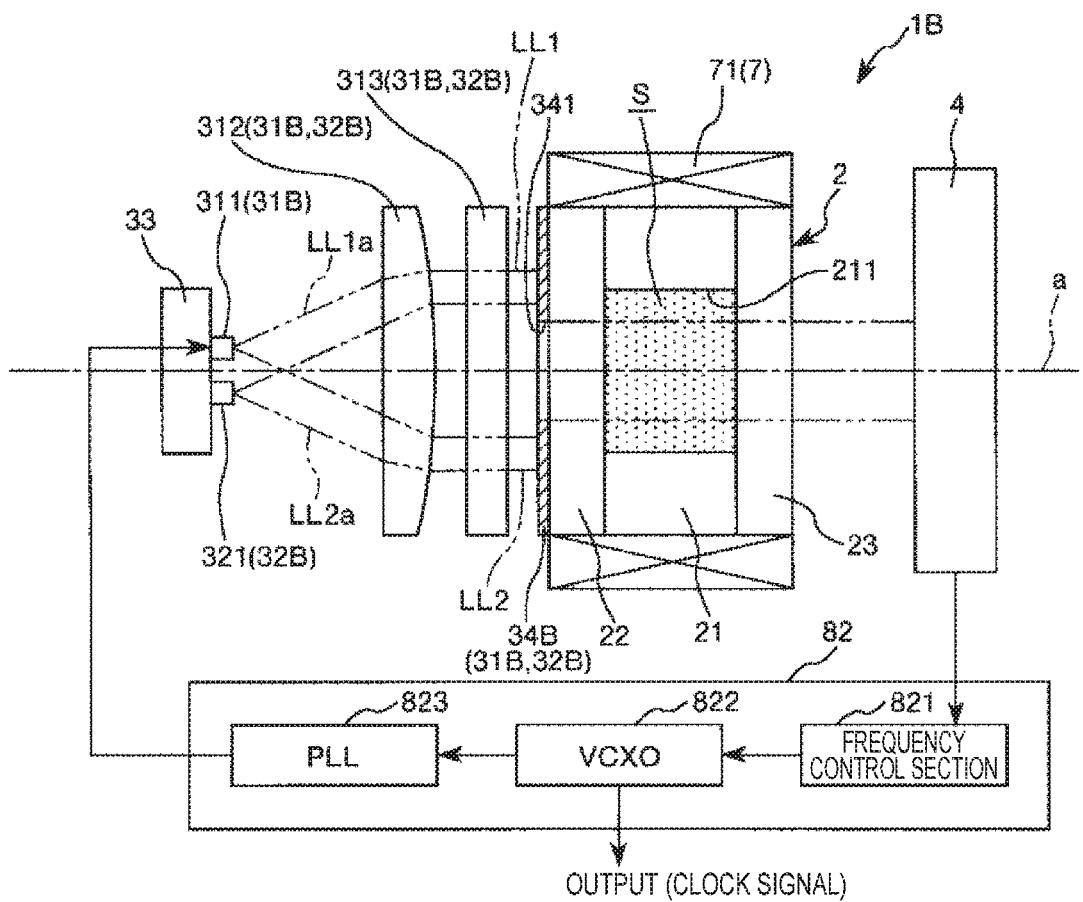
FIG. 8 is a schematic diagram for describing the light source section, an atom cell, and an aperture member provided to an atomic oscillator according to a third embodiment of the invention.

FIG. 8 is a schematic diagram for describing the light source section, an atom cell, and an aperture member provided to an atomic oscillator according to the third embodiment of the invention.

The present embodiment is substantially the same as the first embodiment described above except the point that the arrangement of the aperture member is different.

It should be noted that in the description below, the third embodiment will be described with a focus on the difference from the embodiment described above, and the description of substantially the same issues will be omitted. Further, in FIG. 8, the constituents substantially identical to those of the embodiments described above are denoted by the same reference symbols.

The atomic oscillator 1B shown in FIG. 8 is provided with a first light source section 31B constituted by the first light source 311, the lens 312, the ¼ wave plate 313, and an aperture member 34B, and a second light source section 32B constituted by the second light source 321, the lens 312, the ¼ wave plate 313, and the aperture member 34B.

The aperture member 34B is disposed between the ¼ wave plate 313 and the internal space S. Thus, the distance between the aperture member 34B and the internal space S can be shortened. Therefore, the adjustment of the shapes of the passing areas of the resonance light pair LL1 and the adjustment light LL2 entering the internal space S of the atom cell 2 becomes easy.

Further, the aperture member 34B is disposed on the atom cell 2. Thus, the aperture member 34B and the atom cell 2 can be disposed in a lump, and manufacturing of the atomic oscillator 1B becomes easy. Further, it is possible to reduce the chance for the position of the opening 341 of the aperture member 34B with respect to the internal space S of the atom cell 2 to fluctuate.

According also to the third embodiment explained hereinabove, the strength of the EIT signal can effectively be increased.

2. Electronic Apparatus

Such an atomic oscillator as described hereinabove can be incorporated in a variety of electronic apparatuses.

The electronic apparatus according to the invention will hereinafter be described.

Figure 9:
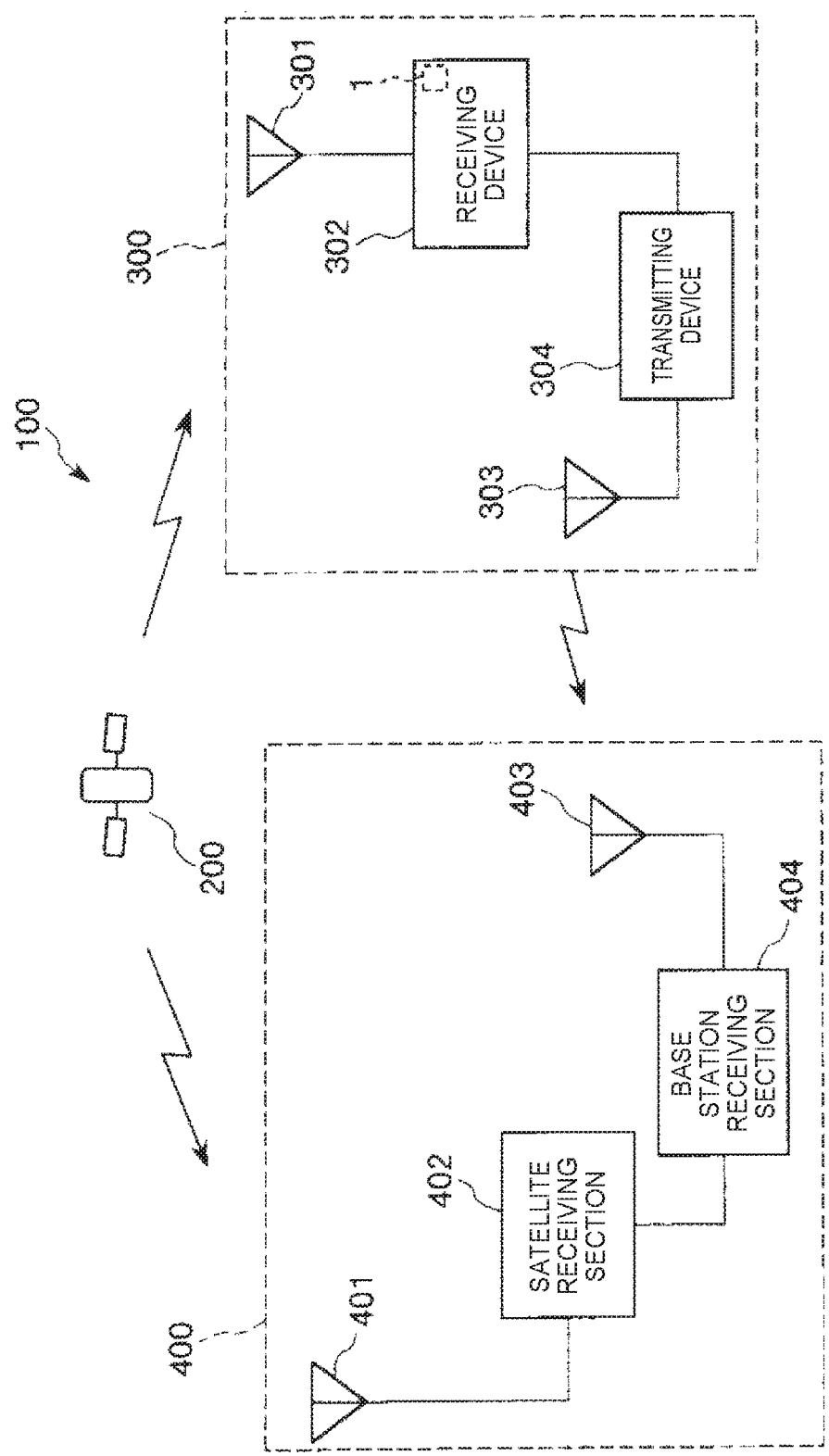
FIG. 9 is a diagram showing a schematic configuration in the case of using the atomic oscillator according to the invention to a positioning system using GPS satellites.

FIG. 9 is a diagram showing a schematic configuration in the case of using the atomic oscillator according to the invention to a positioning system using GPS satellites.

The positioning system 100 shown in FIG. 9 is constituted by GPS satellites 200, a base station device 300, and a GPS receiving device 400.

The GPS satellites 200 each transmit positioning information (a GPS signal).

The base station device 300 is provided with a receiving device 302 for accurately receiving the positioning information from the GPS satellites 200 via an antenna 301 installed at, for example, an electronic reference point (a GPS continuous observation station), and a transmitting device 304 for transmitting the positioning information, which has been received by the receiving device 302, via an antenna 303.

Here, the receiving device 302 is an electronic device equipped with the atomic oscillator 1 according to the invention described above as a reference frequency oscillation source for the receiving device 302. Such a receiving device 302 has excellent reliability. Further, the positioning information having been received by the receiving device 302 is transmitted by the transmitting device 304 in real time.

The GPS receiving device 400 is provided with a satellite receiving section 402 for receiving the positioning information from the GPS satellites 200 via an antenna 401, and a base station receiving section 404 for receiving the positioning information from the base station device 300 via an antenna 403.

3. Moving Object

Figure 10:
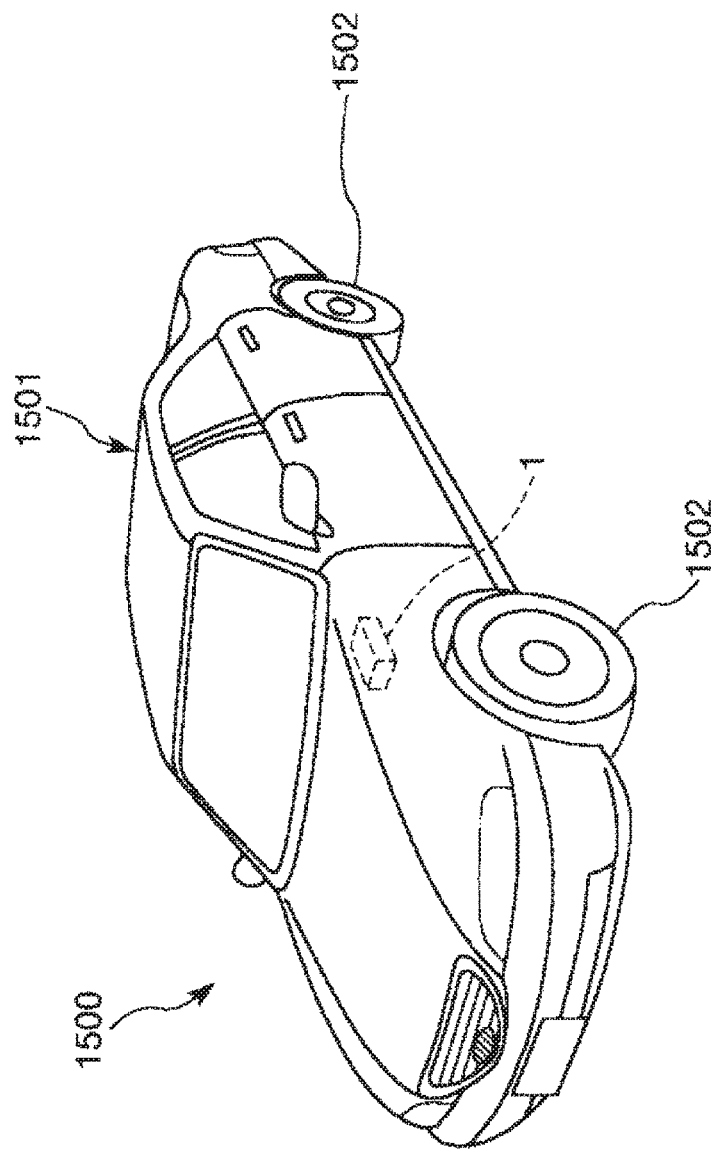
FIG. 10 is a diagram showing an example of a moving object according to the invention.

FIG. 10 is a diagram showing an example of the moving object according to the invention.

In the drawing, the moving object 1500 has a vehicle body 1501, and four wheels 1502, and is configured to rotate the wheels 1502 by a power source (an engine) not shown provided to the vehicle body 1501. Such a moving object 1500 incorporates the atomic oscillator 1.

It should be noted that, the electronic apparatus according to the invention is not limited to those described above, and as the electronic apparatus according to the invention, there can be cited, for example, a smartphone, a tablet terminal, a timepiece, a cellular phone, a digital still camera, an inkjet ejection device (e.g., an inkjet printer), a personal computer (a mobile personal computer and a laptop personal computer), a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), a flight simulator, digital terrestrial broadcasting equipment, a cellular phone base station, and a GPS module.

Although the quantum interference device, the atomic oscillator, the electronic apparatus, and the moving object according to the invention are hereinabove described based on the embodiments shown in the accompanying drawings, the invention is not limited to the embodiments.

Further, the configuration of each of the sections of the invention can be replaced with an arbitrary configuration having substantially the same function, and further, it is also possible to add an arbitrary constituent. Further, the invention can be a combination of any of constituents in each of the embodiments described above.

What is claimed is:

1. A quantum interference device comprising:
   an atom cell having an internal space in which metal is encapsulated;
   a first light source having a first light emitting element, the first light source being configured to generate first light including a resonance light pair, which is circularly polarized in the same direction as each other and resonates the metal based on light emitted from the first light emitting element, the resonance light pair being configured with first and second resonance lights, the first light being incident to the internal space;
   a second light source having a second light emitting element, the second light source being configured to generate second light including adjustment light, which is circularly polarized in a rotational direction opposite to the direction of the resonance light pair and resonates the metal based on light emitted from the second light emitting element, the adjustment light being configured by a third resonance light, the second light being incident to the internal space from the same side as the first light; and
   an aperture member disposed between the internal space and the first and second light emitting elements, the aperture member having an opening.

2. The quantum interference device according to claim 1, wherein
   the first light source and the second light source are commonly provided with a ¼ wave plate, and the ¼ wave plate is disposed between the internal space and the first and second light emitting elements.

3. The quantum interference device according to claim 2, wherein
   the aperture member is disposed between the ¼ wave plate and the first and second light emitting elements.

4. The quantum interference device according to claim 2, wherein
   the aperture member is disposed between the ¼ wave plate and the internal space.

5. The quantum interference device according to claim 3, wherein
   the aperture member is disposed on the ¼ wave plate.

6. The quantum interference device according to claim 4, wherein
   the aperture member is disposed on the atom cell.

7. The quantum interference device according to claim 1, further comprising:
   a lens disposed between the aperture member and the first and second light emitting elements.

8. The quantum interference device according to claim 1, wherein
   the first light emitting element and the second light emitting element are disposed on a same substrate.

9. The quantum interference device according to claim 1, wherein
   one of the resonance light pair and the adjustment light is a D1 line, and the other is a D2 line.

10. The quantum interference device according to claim 1, wherein
    the first light emitting element is a surface emitting laser.

11. The quantum interference device according to claim 1, wherein
    the second light emitting element is a surface emitting laser.

12. The quantum interference device according to claim 1, wherein
    the second light emitting element is a light emitting diode.

13. An atomic oscillator comprising:
    the quantum interference device according to claim 1; and
    a light receiver that is configured to receive light which is output from the atom cell.

14. An electronic apparatus comprising:
    the quantum interference device according to claim 1; and
    a receive that is configured to receive information via antenna,
    wherein the quantum interference device is located in the receiver.

15. An electronic apparatus comprising:
    the quantum interference device according to claim 2; and
    a receive that is configured to receive information via antenna,
    wherein the quantum interference device is located in the receiver.

16. An electronic apparatus comprising:
    the quantum interference device according to claim 3; and
    a receive that is configured to receive information via antenna,
    wherein the quantum interference device is located in the receiver.

17. A moving object comprising:
    the quantum interference device according to claim 1; and
    a movable body that houses the quantum interference device.

18. A moving object comprising:
    the quantum interference device according to claim 2; and
    a movable body that houses the quantum interference device.

19. The quantum interference device according to claim 1, wherein only part of the first and second lights passes through the opening of the aperture member.

20. The quantum interference device according to claim 1, wherein the aperture member excluding the opening has a light blocking property.

* * * * *